United States Patent
Sakuda (10) Patent No.: US 9,430,602 B2
(45) Date of Patent: Aug. 30, 2016

(54) SEMICONDUCTOR INTEGRATED CIRCUIT DEVICE AND METHOD FOR DESIGNING LAYOUT OF THE SAME HAVING STANDARD CELLS, BASIC CELLS AND A PROTECTIVE DIODE CELL

(71) Applicant: SEIKO EPSON CORPORATION, Tokyo (JP)

(72) Inventor: Takashi Sakuda, Kai (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/575,278

(22) Filed: Dec. 18, 2014

(65) Prior Publication Data

US 2015/0178433 A1  Jun. 25, 2015

(30) Foreign Application Priority Data

Dec. 24, 2013  (JP) ................. 2013-265007

(51) Int. Cl.
*G06F 17/50* (2006.01)
*H01L 27/02* (2006.01)
*H01L 27/118* (2006.01)

(52) U.S. Cl.
CPC ....... *G06F 17/5068* (2013.01); *H01L 27/0207* (2013.01); *H01L 27/11807* (2013.01); *G06F 17/5072* (2013.01)

(58) Field of Classification Search
CPC ................ G06F 17/5068; G06F 17/5072
USPC ......................... 716/118–119, 122
See application file for complete search history.

(56) References Cited

U.S. PATENT DOCUMENTS

| | | | | |
|---|---|---|---|---|
| 6,308,308 B1 * | 10/2001 | Cronin, III | .......... | H01L 27/0207 716/112 |
| 6,594,809 B2 * | 7/2003 | Wang | .................. | H01L 27/0629 257/E27.016 |
| 7,073,148 B1 * | 7/2006 | Jenkins | ............... | G06F 17/5081 716/112 |
| 7,114,140 B2 * | 9/2006 | Ishikura | ............... | G06F 17/5072 257/E23.02 |
| 7,843,673 B2 * | 11/2010 | Ng | ....................... | H01L 27/0255 361/56 |
| 8,504,969 B2 * | 8/2013 | Lin | ..................... | G06F 17/5068 716/110 |
| 2003/0135835 A1 * | 7/2003 | Komaki | ............... | G06F 17/5068 716/122 |
| 2012/0286331 A1 * | 11/2012 | Aton | .................... | H01L 27/0207 257/202 |
| 2013/0146988 A1 * | 6/2013 | Becker | ................ | H01L 27/0207 257/369 |
| 2014/0173544 A1 * | 6/2014 | Giraud | ................ | G06F 17/5068 716/119 |

FOREIGN PATENT DOCUMENTS

JP   A-2000-332206   11/2000

* cited by examiner

*Primary Examiner* — Stacy Whitmore
(74) *Attorney, Agent, or Firm* — Oliff PLC (57) ABSTRACT

A method for designing a layout of a semiconductor integrated circuit device includes placing a plurality of standard cells respectively constituting a plurality of functional blocks in a part of a logic circuit placement region, placing a plurality of basic cells in a part of regions of the logic circuit placement region in which no standard cells are placed, and placing at least one diode cell in at least a part of regions of the logic circuit placement region in which no standard cells and no basic cells are placed, the diode cell including a first and a second diode, the first diode being connected between a gate electrode of a predetermined transistor and a first power supply line and the second diode between the gate electrode and a second power supply line.

8 Claims, 10 Drawing Sheets

SEMICONDUCTOR INTEGRATED CIRCUIT DEVICE AND METHOD FOR DESIGNING LAYOUT OF THE SAME HAVING STANDARD CELLS, BASIC CELLS AND A PROTECTIVE DIODE CELL

BACKGROUND

1. Technical Field

The present invention generally relates to a semiconductor integrated circuit device, and particularly relates to a semiconductor integrated circuit device that is manufactured using a standard cell methodology. Furthermore, the present invention relates to a method for designing the layout of such a semiconductor integrated circuit device.

2. Related Art

In layout design of a standard-cell semiconductor integrated circuit device, placement and routing of circuit elements such as MOS transistors are determined by placing and connecting a plurality of types of standard cells constituting circuit blocks that realize desired functions using a computer. At this time, in order to prevent deterioration of the gate dielectric of a MOS transistor due to the antenna effect, a protective diode is connected between the gate electrode of a predetermined MOS transistor and a power supply line.

The antenna effect is a phenomenon in which in an etching process of a metal interconnect layer of a semiconductor integrated circuit device, an electric charge is accumulated in a long interconnect. For example, during plasma etching of the metal interconnect layer, if the amount of electric charge that is accumulated on a gate electrode connected to a long interconnect increases, an electrical breakdown of a gate dielectric occurs, leading to deterioration of the gate dielectric, which may become a primary factor in the occurrence of a leakage current. Therefore, in the etching process of the metal interconnect layer, when a long interconnect that is connected to the gate electrode of a MOS transistor is formed and this interconnect is not connected to the source or the drain of another MOS transistor, the antenna effect causes a problem.

In order to prevent deterioration of gate dielectrics due to the antenna effect described above, in layout design of a standard-cell semiconductor integrated circuit device of related art, after placement of a plurality of standard cells, protective diodes are preferentially placed in empty regions.

As an example of related art, JP-A-2000-332206 (paragraphs 0015-0017, FIGS. 1 and 2) discloses a semiconductor integrated circuit device that is aimed at reliably preventing breakdown or the like of the gate oxide of a transistor due to the antenna effect without increasing the area of an LSI chip.

In this semiconductor integrated circuit device, a plurality of standard cells corresponding to logic functions are provided, gaps are provided between the standard cells, the gaps serving as unused regions in which no standard cell is provided, and metal interconnects for electrically connecting the standard cells to each other are provided. In a part of the unused regions, protective cells for protecting against the antenna effect are provided between a power supply line and a ground line, input terminals of the protective cells are connected to the metal interconnects, and thus the standard cells are protected from breakdown of gate oxides that is caused by the antenna effect.

However, in manufacturing of a semiconductor integrated circuit device, there are cases where the need to perform circuit modification arises after a photomask to be used to form gate electrodes, impurity diffusion regions, and interconnects on a semiconductor substrate is produced. Furthermore, there also are cases where the need to perform circuit modification arises after the gate electrodes and the impurity diffusion regions are actually formed on the semiconductor substrate. In layout design of standard-cell semiconductor integrated circuit devices of related art, no consideration has been given to a measure for allowing circuit modification to be performed in such cases.

SUMMARY

An advantage of some aspects of the invention is to provide a semiconductor integrated circuit device that ensures flexibility with respect to circuit modification even if circuit modification is performed after a photomask for use in a manufacturing process of the semiconductor integrated circuit device is produced and that is capable of realizing a countermeasure against the antenna effect, without increasing the area of a semiconductor substrate.

A method for designing a layout of a semiconductor integrated circuit device according to a first aspect of the invention includes (a) placing a plurality of standard cells respectively constituting a plurality of functional blocks that realize logic functions of the semiconductor integrated circuit device in a part of a logic circuit placement region, (b) placing a plurality of basic cells in a part of regions of the logic circuit placement region in which no standard cells are placed, and (c) placing at least one diode cell in at least a part of regions of the logic circuit placement region in which no standard cells and no basic cells are placed, the diode cell including a first diode that is connected between a gate electrode of a predetermined transistor and a first power supply line and a second diode that is connected between the gate electrode and a second power supply line.

Also, a semiconductor integrated circuit device according to the first aspect of the invention is a semiconductor integrated circuit device including a semiconductor substrate having a logic circuit placement region, the semiconductor integrated circuit device including a plurality of standard cells that are placed in a part of the logic circuit placement region and respectively constitute a plurality of functional blocks that realize logic functions of the semiconductor integrated circuit device, a plurality of basic cells that are placed in a part of regions of the logic circuit placement region in which no standard cells are placed, and at least one diode cell that is placed in at least a part of regions of the logic circuit placement region in which no standard cells and no basic cells are placed, the diode cell including a first diode that is connected between a gate electrode of a predetermined transistor and a first power supply line and a second diode that is connected between the gate electrode and a second power supply line, wherein the diode cell is placed, in a direction that is orthogonal to a longitudinal direction of the diode cell, in at least a part of regions between two adjacent standard cells, regions between a standard cell and a basic cell, or regions at an end portion of the logic circuit placement region.

According to the first aspect of the invention, the general-purpose basic cells and the protective diode cell are placed in regions of the logic circuit placement region in which no standard cells are placed, and the basic cells can be used as a functional block by simply changing an interconnect layer. Therefore, a semiconductor integrated circuit device that ensures flexibility with respect to circuit modification even if circuit modification is performed after a photomask for use in a manufacturing process of the semiconductor integrated circuit device is produced and that is capable of realizing a countermeasure against the antenna effect can be provided without increasing the area of the semiconductor substrate.

Here, it is also possible that the basic cells have a width that is larger than a width of the diode cell, and the standard cells, the basic cells, and the diode cell have substantially equal lengths. In that case, the diode cell can be placed in an unoccupied region of the logic circuit placement region after the standard cells and the basic cells are placed.

A method for designing a layout of a semiconductor integrated circuit device according to a second aspect of the invention is the method for designing a layout of a semiconductor integrated circuit device according to the first aspect of the invention, wherein (b) placing the plurality of basic cells includes (b1) placing a plurality of first basic cells in a part of regions of the logic circuit placement region in which no standard cells are placed and (b2) placing a plurality of second basic cells in a part of regions of the logic circuit placement region in which no standard cells and no first basic cells are placed, the second basic cells having a width that is smaller than a width of the first basic cells and larger than a width of the diode cell.

Also, a semiconductor integrated circuit device according to the second aspect of the invention is the semiconductor integrated circuit device according to the first aspect of the invention, wherein the plurality of basic cells include a plurality of first basic cells that are placed in a part of regions of the logic circuit placement region in which no standard cells are placed, and a plurality of second basic cells that are placed in a part of regions of the logic circuit placement region in which no standard cells and no first basic cells are placed, the second basic cells having a width that is smaller than a width of the first basic cells and larger than a width of the diode cell.

According to the second aspect of the invention, the first and second general-purpose basic cells and the protective diode cell are placed in regions of the logic circuit placement region in which no standard cells are placed, and the first and second basic cells can be used as a functional block by simply changing the interconnect layer. Therefore, a semiconductor integrated circuit device that further increases the flexibility with respect to circuit modification even if circuit modification is performed after the photomask for use in the manufacturing process of the semiconductor integrated circuit device is produced and that is capable of realizing a countermeasure against the antenna effect can be provided without increasing the area of the semiconductor substrate.

Here, it is also possible that the width of the first basic cells is approximately three times the width of the diode cell, the width of the second basic cells is approximately twice the width of the diode cell, and the standard cells, the first basic cells, the second basic cells, and the diode cell have substantially equal lengths. In that case, it is possible to place the second basic cells in unoccupied regions of the logic circuit placement region after the standard cells and the first basic cells are placed, and furthermore to place the diode cell in an unoccupied region after the second basic cells are placed.

With respect to the above-described aspects, it is also possible that the basic cells or the first basic cells each include a first P-channel transistor and a first N-channel transistor that have a common first gate electrode, and a second P-channel transistor and a second N-channel transistor that have a common second gate electrode. In that case, various types of functional blocks can be configured by connecting interconnects to one or more basic cells or one or more first basic cells.

Moreover, it is also possible that the second basic cells each include a third P-channel transistor and a third N-channel transistor that have a common third gate electrode. In that case, various types of functional blocks can be configured by connecting interconnects to one or more first basic cells and a second basic cell. Alternatively, an inverter can be configured by connecting interconnects to a second basic cell.

BRIEF DESCRIPTION OF THE DRAWINGS

The invention will be described with reference to the accompanying drawings, wherein like numbers reference like elements.

DESCRIPTION OF EXEMPLARY EMBODIMENTS

The following describes embodiments of the invention with reference to the drawings. Note that like constituent elements are denoted by like reference numbers, and redundant descriptions thereof are omitted.

Figure 1:
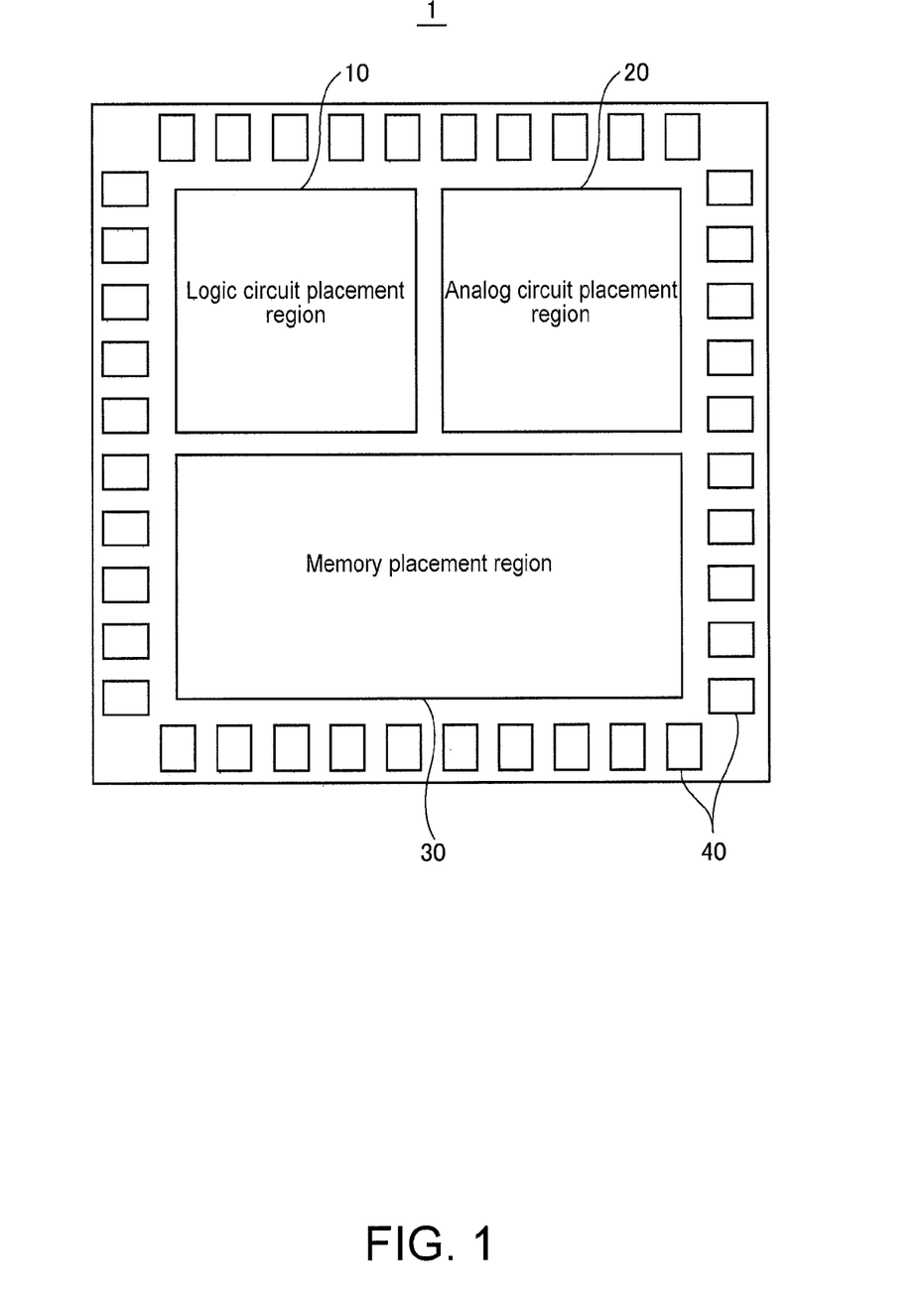
FIG. 1 is a plan view showing the layout of a semiconductor integrated circuit device according to embodiments of the invention.

FIG. 1 is a plan view schematically showing the layout of a semiconductor integrated circuit device according to embodiments of the invention. As shown in FIG. 1, this semiconductor integrated circuit device includes a semiconductor substrate 1 that is formed of a semiconductor material such as silicon. The semiconductor substrate 1 has at least a logic circuit placement region 10, and may further have at least one of an analog circuit placement region 20, a memory placement region 30, and an I/O cell placement region 40.

In the logic circuit placement region 10, various types of cells constituting logic circuits and a diode cell for protecting a predetermined MOS transistor against the antenna effect are placed. In the analog circuit placement region 20, an analog circuit such as an analog IP (functional block) is placed. In the memory placement region 30, a memory such as a memory IP is placed. In the I/O cell placement region 40, an I/O cell including a power supply terminal or an input/output terminal and, if necessary, an input/output circuit is placed.

Figure 2:
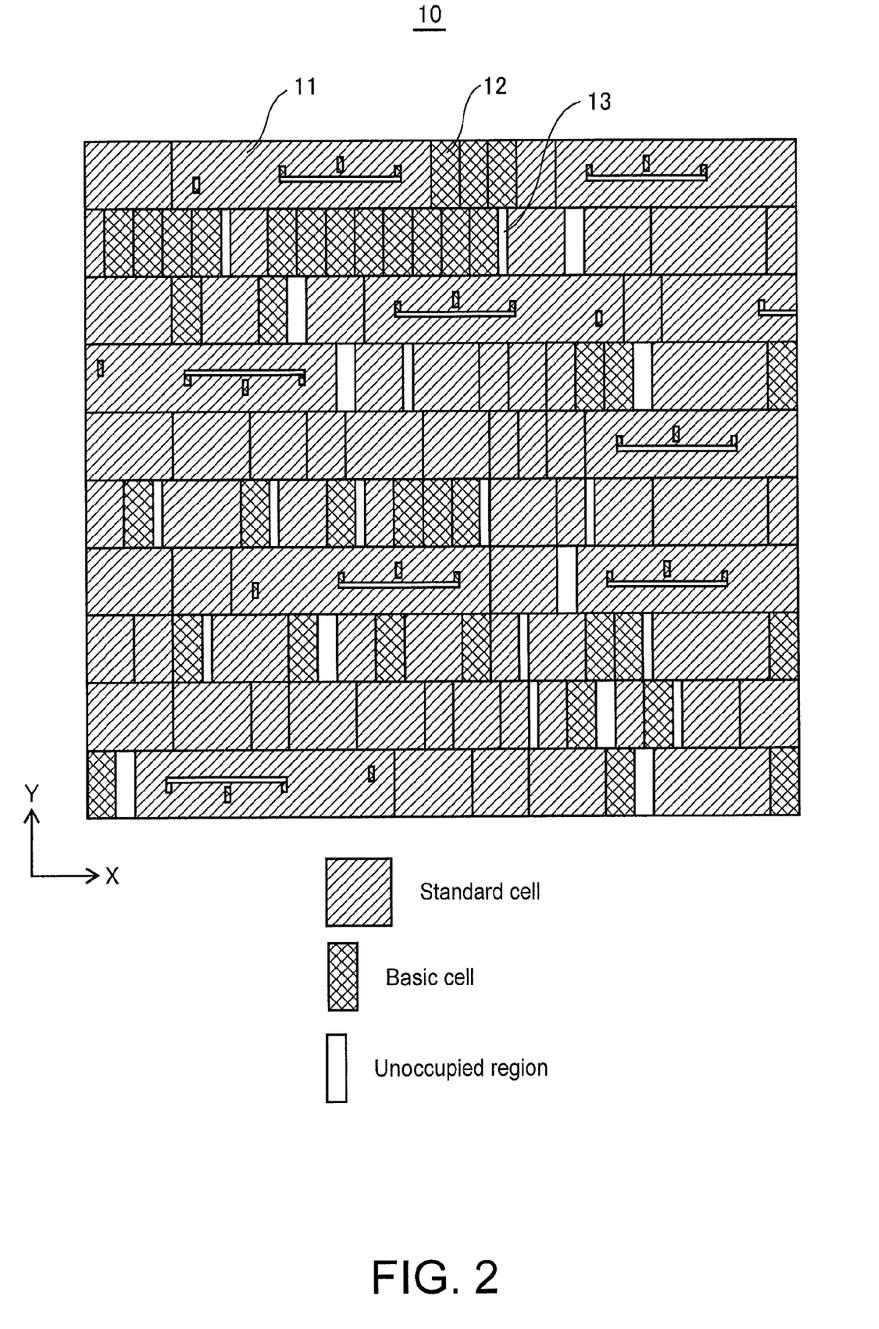
FIG. 2 is a plan view of a logic circuit placement region of a semiconductor integrated circuit device according to a first embodiment.

FIG. 2 is a plan view showing a part of the logic circuit placement region of a semiconductor integrated circuit device according to a first embodiment of the invention in an enlarged manner. As shown in FIG. 2, in the logic circuit placement region 10, a plurality of standard cells 11, a plurality of basic cells 12, and at least one diode cell 13 are placed.

The plurality of standard cells 11 are placed in a part of the logic circuit placement region 10 and respectively constitute a plurality of functional blocks that realize logic functions of the semiconductor integrated circuit device. Each of the standard cells 11 includes a plurality of transistors and interconnects inside that cell for connecting the transistors to each other, and the standard cells 11 constitute various types of functional blocks such as an inverter, a buffer, an AND circuit, a NAND circuit, an OR circuit, a NOR circuit, or a flip-flop. The logic functions of the semiconductor integrated circuit device are realized by connecting the plurality of standard cells 11 to each other with interconnects between the cells.

The basic cells 12 are general-purpose cells that are placed in a part of regions of the logic circuit placement region 10 in which no standard cells 11 are placed and that have no interconnect layer. That is to say, a single basic cell 12, before a change is made to the interconnect layer, is a cell that is not electrically connected to the other basic cells, the standard cells 11, and the like. Each basic cell 12 includes a plurality of transistors, and can be used in circuit modification after a photomask for use in the manufacturing process of the semiconductor integrated circuit device is produced, or in circuit modification after gate electrodes and impurity diffusion regions are actually formed on the semiconductor substrate. In such cases, a desired functional block can be configured by changing only the interconnect layer and connecting the interconnects to a basic cell 12.

The diode cell 13 is placed in at least a part of regions (unoccupied regions in FIG. 2) of the logic circuit placement region 10 in which no standard cells 11 and no basic cells 12 are placed. The diode cell 13 includes a first diode that is connected between the gate electrode of a predetermined transistor and a first power supply line and a second diode that is connected between that gate electrode and a second power supply line.

Among the above-described cells, the standard cells 11 have varying sizes, but the basic cells 12 and the diode cell 13 have fixed sizes. In the present application, the dimension of each cell of the basic cells 12 and the diode cell 13 in a longitudinal direction (Y-axis direction in FIG. 2) is referred to as the "length" of that cell, and the dimension of each cell of the basic cells 12 and the diode cell 13 in a direction (X-axis direction in FIG. 2) that is orthogonal to the longitudinal direction is referred to as the "width" of that cell.

The diode cell 13 has the smallest size among the above-described cells. The sizes of the individual standard cells 11 are M times the size of the diode cell 13 (M is an integer of 2 or more), and the size of the basic cells 12 is N times the size of the diode cell 13 (N is an integer of 2 or more).

Hereinafter, a case where the lengths of the individual standard cells 11, the length of the basic cells 12, and the length of the diode cell 13 are substantially equal will be described as an example. In that case, the widths of the individual standard cells 11 are M times the width of the diode cell 13, and the width of the basic cells 12 is N times the width of the diode cell 13. That is to say, the width of the basic cells 12 is larger than the width of the diode cell 13. It is therefore possible to place the diode cell 13 in an unoccupied region of the logic circuit placement region 10 after the standard cells 11 and the basic cells 12 are placed. For example, the width of the basic cells 12 may be approximately three times the width of the diode cell 13.

The basic cells 12 can be used to configure a functional block that is required in performing circuit modification, and therefore it is desirable to place as many basic cells 12 as possible in regions of the logic circuit placement region 10 in which no standard cells 11 are placed. Moreover, a larger-scale functional block can be configured by using a plurality of basic cells 12, and therefore, in the case where a region in which no standard cells 11 are placed has a width that is two or more times the width of the basic cells 12 in the X-axis direction shown in FIG. 2, it is desirable to contiguously place a plurality of basic cells 12 therein.

The diode cell 13 is placed using an unoccupied region in which the standard cells 11 and the basic cells 12 cannot be placed. Accordingly, in the direction (X-axis direction in FIG. 2) that is orthogonal to the longitudinal direction of the diode cell 13, the diode cell 13 is placed in at least a part of regions between two adjacent standard cells 11, regions between a standard cell 11 and a basic cell 12, or regions at an end portion of the logic circuit placement region 10. That is to say, no diode cell 13 is placed in regions between two adjacent basic cells 12.

Figure 3:
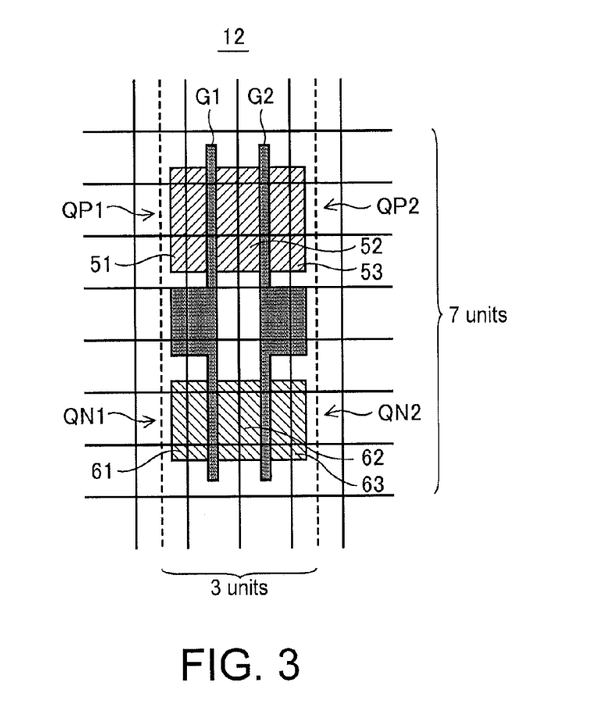
FIG. 3 is a plan view showing an example of the layout of a basic cell in FIG. 2.

FIG. 3 is a plan view showing an example of the layout of a basic cell in FIG. 2. In FIG. 3, in order to clearly indicate the size of the basic cells 12, a grid (lattice) based on which the layout of the semiconductor integrated circuit device is designed is shown. In the example shown in FIG. 3, the basic cell 12 has a length of seven units of the grid and a width of three units.

The basic cell 12 includes, for example, a P-channel MOS transistor QP1 and an N-channel MOS transistor QN1 that have a common gate electrode G1 as well as a P-channel MOS transistor QP2 and an N-channel MOS transistor QN2 that have a common gate electrode G2.

P-type impurity diffusion regions 51 to 53 are formed in an N-well of a semiconductor substrate or an N-type semiconductor substrate. The source and the drain of the transistor QP1 are configured by the P-type impurity diffusion regions 51 and 52. Also, the source and the drain of the transistor QP2 are configured by the P-type impurity diffusion regions 52 and 53.

On the other hand, N-type impurity diffusion regions 61 to 63 are formed in a P-well of the semiconductor substrate or a P-type semiconductor substrate. The source and the drain of the transistor QN1 are configured by the N-type impurity diffusion regions 61 and 62. Also, the source and the drain of the transistor QN2 are configured by the N-type impurity diffusion regions 62 and 63.

Placement of the plurality of basic cells 12 in a part of the regions of the logic circuit placement region 10 shown in FIG. 2 in which no standard cells 11 are placed makes it possible to flexibly deal with circuit modification by simply changing the interconnect layer, even if circuit modification is performed after the photomask for use in the manufacturing process of the semiconductor integrated circuit device is produced. That is to say, various types of functional blocks can be configured by connecting the interconnects to one or more basic cells 12.

For example, one or two inverters, a NAND circuit, or a NOR circuit can be configured using a single basic cell 12. Moreover, a two-input multiplexer (selection circuit) can be configured using four basic cells 12. Furthermore, a latch circuit with a reset can be configured using six basic cells 12. Hereinafter, a case where a NAND circuit is configured using a single basic cell 12 will be described as an example.

Figure 4:
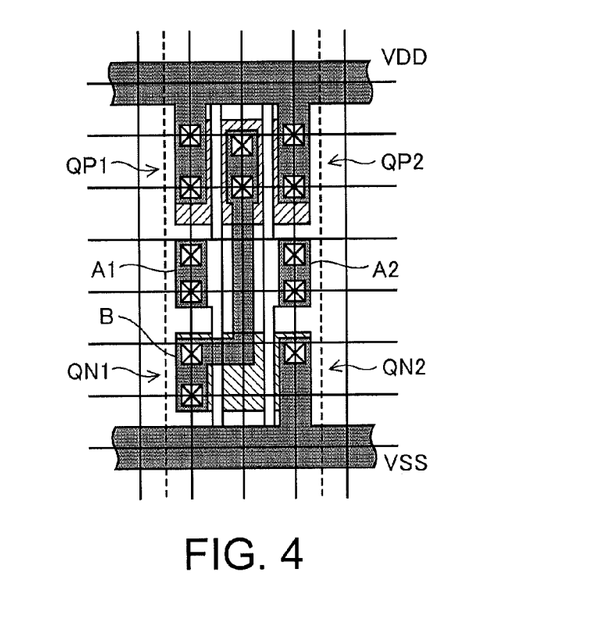
FIG. 4 is a plan view showing an example of the layout of a NAND circuit that is configured using the basic cell.

FIG. 4 is a plan view showing an example of the layout of a NAND circuit that is configured using the basic cell shown in FIG. 3. In FIG. 4, the "x" marks indicate the positions of through holes that are formed in an interlayer dielectric. Interconnects that are formed on the interlayer dielectric are connected to the gate electrodes or the impurity diffusion regions of the plurality of transistors included in the basic cell 12 via the through holes.

Figure 5:
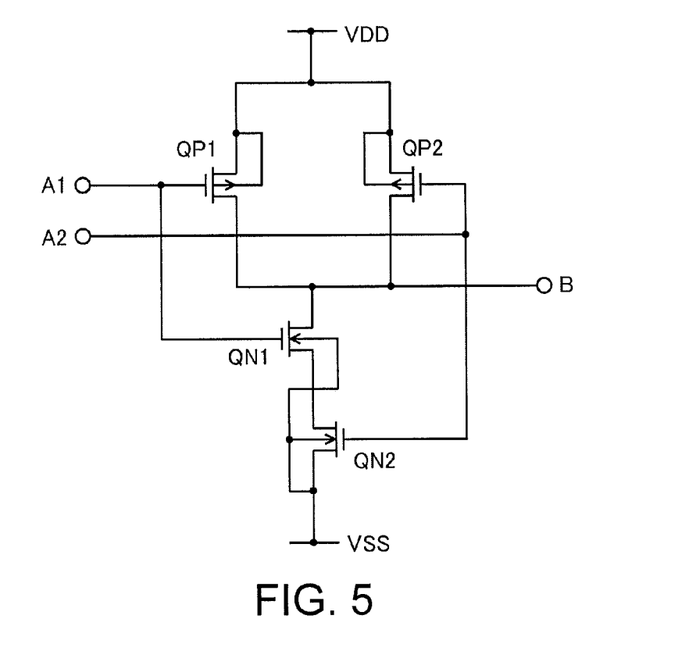
FIG. 5 is a circuit diagram showing the configuration of the NAND circuit shown in FIG. 4.

FIG. 5 is a circuit diagram showing the configuration of the NAND circuit shown in FIG. 4. As shown in FIGS. 4 and 5, in this NAND circuit, the sources of the transistors QP1 and QP2 are connected to the first power supply line to which a power supply potential VDD on the high potential side is supplied, and the drains of the transistors QP1 and QP2 are integrally formed with each other and connected to an interconnect of an output terminal B. The gate of the transistor QP1 is connected to an interconnect of an input terminal A1, and the gate of the transistor QP2 is connected to an interconnect of an input terminal A2.

Moreover, the drain of the transistor QN1 is connected to the interconnect of the output terminal B, the source of the transistor QN1 is integrally formed with the drain of the transistor QN2, and the source of the transistor QN2 is connected to the second power supply line to which a power supply potential VSS on the low potential side is supplied. The gate of the transistor QN1 is connected to the interconnect of the input terminal A1, and the gate of the transistor QN2 is connected to the interconnect of the input terminal A2.

Thus, the NAND circuit shown in FIGS. 4 and 5 activates an output signal output from the output terminal B to the low level if input signals of the high level are supplied to both of the input terminals A1 and A2, and otherwise deactivates the output signal output from the output terminal B to the high level.

Figure 6:
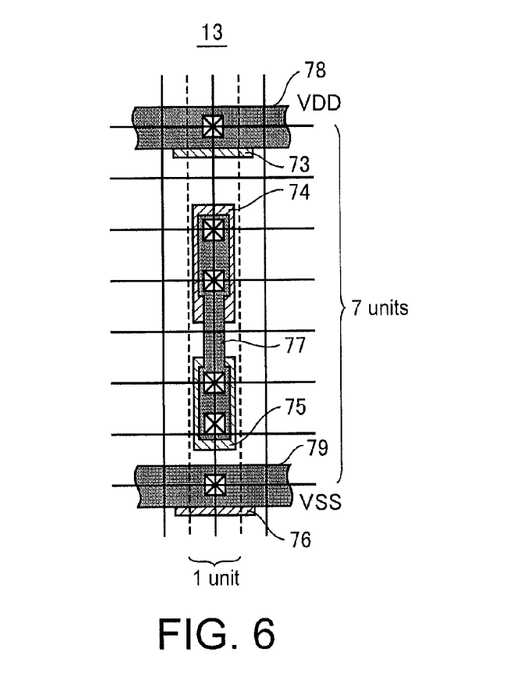
FIG. 6 is a plan view showing an example of the layout of a diode cell in FIG. 2.

FIG. 6 is a plan view showing an example of the layout of a diode cell in FIG. 2. In FIG. 6, in order to clearly indicate the size of the diode cell 13, the grid (lattice) based on which the layout of the semiconductor integrated circuit device is designed is shown. In the example shown in FIG. 6, the diode cell 13 has a length of seven units of the grid and a width of one unit.

Also, in FIG. 6, the "x" marks indicate the positions of through holes that are formed in the interlayer dielectric. Interconnects that are formed on the interlayer dielectric are connected to impurity diffusion regions of the first and second diodes included in the diode cell 13 via the through holes.

Figure 7:
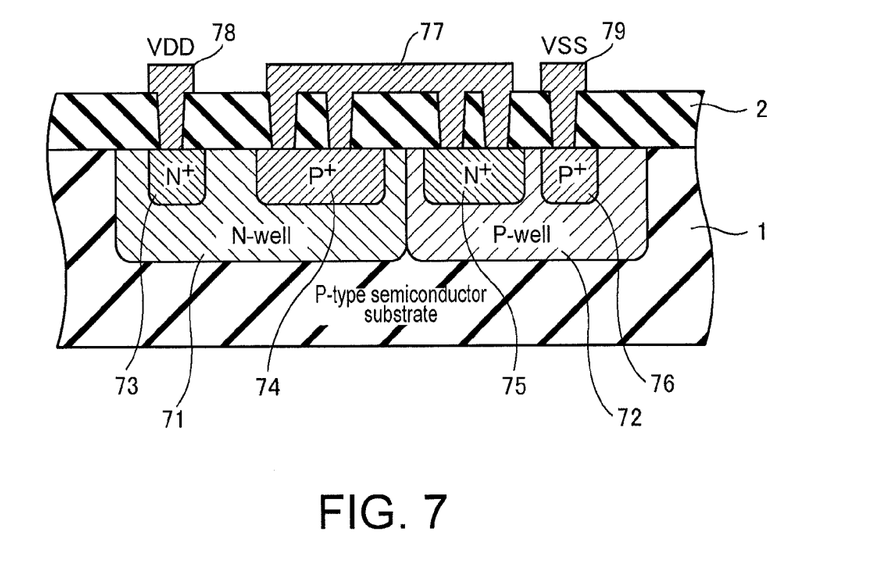
FIG. 7 is a cross-sectional view showing an example of the structure of the diode cell shown in FIG. 6.

FIG. 7 is a cross-sectional view showing an example of the structure of the diode cell shown in FIG. 6. As shown in FIG. 7, an N-well 71 and a P-well 72 are formed in the P-type semiconductor substrate 1. An N-type impurity diffusion region 73 and a P-type impurity diffusion region 74 are formed in the N-well 71. On the other hand, an N-type impurity diffusion region 75 and a P-type impurity diffusion region 76 are formed in the P-well 72. Note that the N-well 71 may be omitted in the case where an N-type semiconductor substrate is used, or the P-well 72 may be omitted in the case where a P-type semiconductor substrate is used.

An interlayer dielectric 2 is formed on the semiconductor substrate 1, and an interconnect 77, a first power supply line 78 to which the power supply potential VDD is supplied, and a second power supply line 79 to which the power supply potential VSS is supplied are formed on the interlayer dielectric 2 and are connected to the corresponding impurity diffusion regions via the through holes that are formed in the interlayer dielectric 2.

The first power supply line 78 is connected to the N-type impurity diffusion region 73, and thus the N-well 71 is also electrically connected to the first power supply line 78. The P-type impurity diffusion region 74 constitutes the anode of the first diode, and the N-well 71 and the N-type impurity diffusion region 73 constitute the cathode of the first diode.

The second power supply line 79 is connected to the P-type impurity diffusion region 76, and thus the P-well 72 is also electrically connected to the second power supply line 79. The P-type impurity diffusion region 76 and the P-well 72 constitute the anode of the second diode, and the N-type impurity diffusion region 75 constitutes the cathode of the second diode.

The P-type impurity diffusion region 74 and the N-type impurity diffusion region 75 are connected to the gate electrode of a predetermined transistor via the interconnect 77. Here, the "predetermined transistor" refers to a transistor to be protected against the antenna effect in the etching process of the metal interconnect layer of the semiconductor integrated circuit device.

Specifically, in the etching process of a certain metal interconnect layer, if an interconnect connected to the gate electrode of a transistor and having a predetermined length (e.g., 10 μm) or more is formed, and that interconnect is not connected to an impurity diffusion region such as the source or the drain of another transistor, the transistor needs to be protected against the antenna effect. In particular, with regard to a transistor having a gate electrode connected to an input terminal via an interconnect in each standard cell, there are cases where that interconnect is not connected to an impurity diffusion region such as the source or the drain of another transistor, and therefore it is highly likely that this transistor should be protected.

Figure 8:
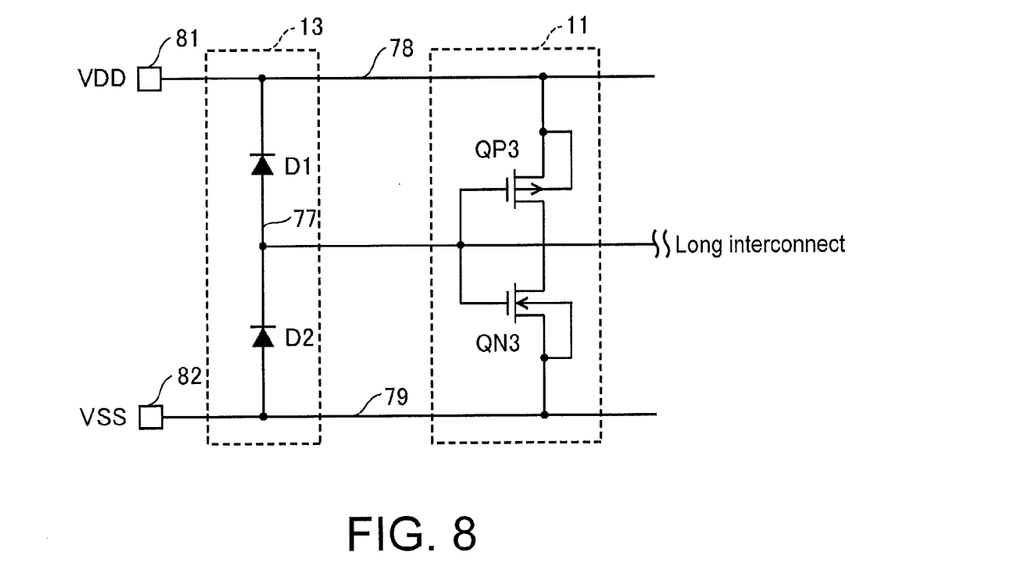
FIG. 8 is a circuit diagram showing an example of connection between the diode cell and a transistor to be protected.

FIG. 8 is a circuit diagram showing an example of connection between the diode cell shown in FIGS. 6 and 7 and a transistor to be protected. In the example shown in FIG. 8, a P-channel MOS transistor QP3 and an N-channel MOS transistor QN3 included in one of the standard cells 11 are to be protected. A long interconnect that is formed in a first interconnect layer is connected to the gate electrode of the transistors QP3 and QN3, and in the first interconnect layer, this interconnect is not connected to any impurity diffusion region such as the source or the drain of another transistor.

As shown in FIG. 8, the diode cell 13 includes a first diode D1 that is connected between the gate electrode of the transistors QP3 and QN3 to be protected and the first power supply line 78, and a second diode D2 that is connected between the gate electrode of the transistors QP3 and QN3 and the second power supply line 79. The first power supply line 78 is connected to a power supply terminal 81 to which the power supply potential VDD is supplied, and the second power supply line 79 is connected to a power supply terminal 82 to which the power supply potential VSS is supplied.

In the etching process of the first interconnect layer, if a positive charge is accumulated on the gate electrode of the transistors QP3 and QN3, the positive charge is released to the first power supply line 78 via the diode D1. Moreover, in the case where the first power supply line 78 is connected to the power supply terminal 81 during etching, the positive charge can be released to the power supply terminal 81.

On the other hand, in the etching process of the first interconnect layer, if a negative charge is accumulated on the gate electrode of the transistors QP3 and QN3, the negative charge is released to the second power supply line 79 via the diode D2. Moreover, in the case where the second power supply line 79 is connected to the power supply terminal 82 during etching, the negative charge can be released to the power supply terminal 82.

Next, a semiconductor integrated circuit device according to a second embodiment of the invention will be described.

Figure 9:
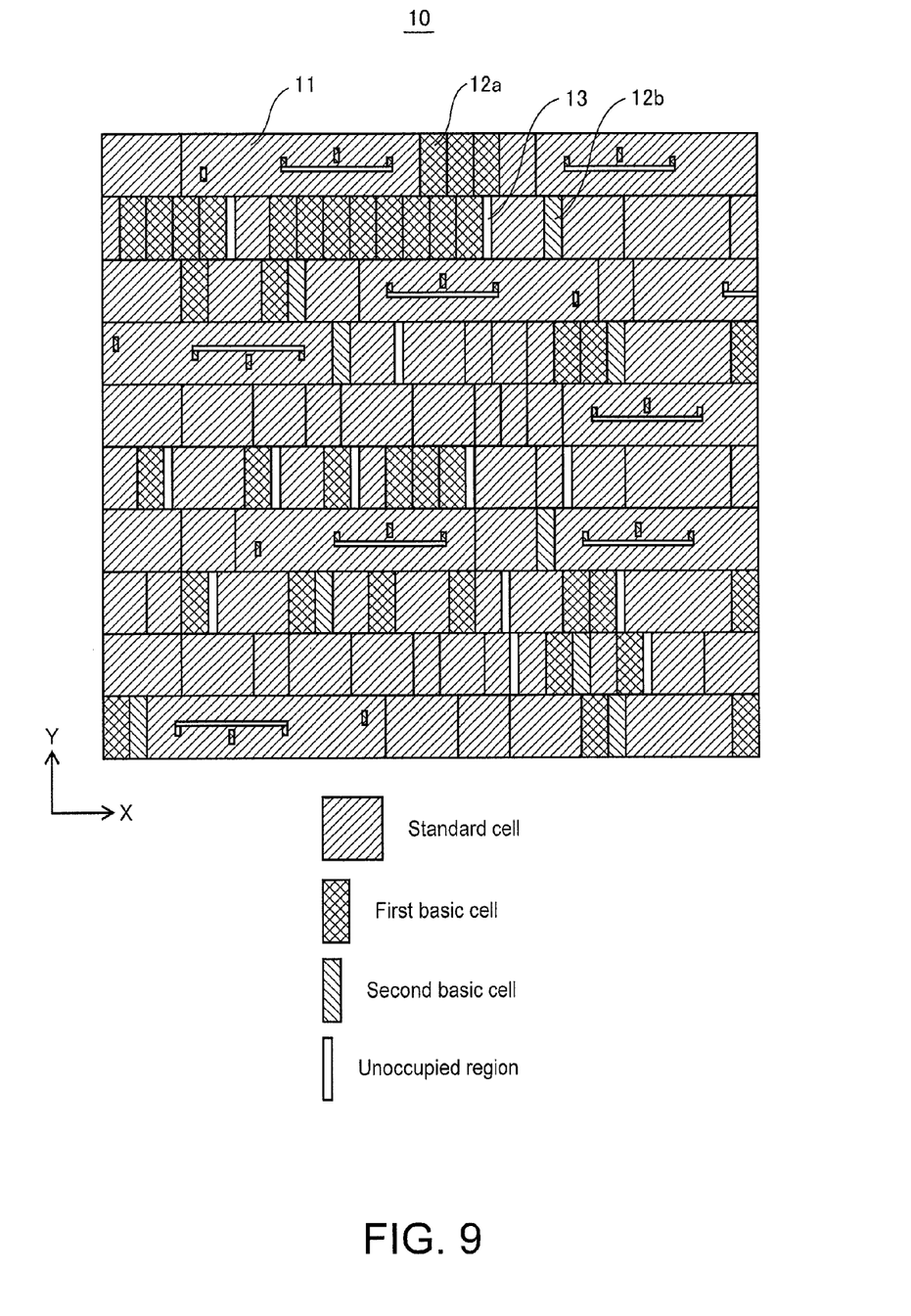
FIG. 9 is a plan view of a logic circuit placement region of a semiconductor integrated circuit device according to a second embodiment.

FIG. 9 is a plan view showing a part of a logic circuit placement region of the semiconductor integrated circuit device according to the second embodiment of the invention in an enlarged manner. In the second embodiment, first basic cells 12a and second basic cells 12b shown in FIG. 9 are used as the basic cells. Otherwise, the semiconductor integrated circuit device according to the second embodiment is similar to the semiconductor integrated circuit device according to the first embodiment.

The first basic cells 12a are general-purpose cells placed in a part of regions of the logic circuit placement region 10 in which no standard cells 11 are placed and having no interconnect layer. For example, the first basic cells 12a may be similar to the basic cells 12 shown in FIG. 3. Also, the second basic cells 12b are general-purpose cells placed in a part of regions of the logic circuit placement region 10 in which no standard cells 11 and no first basic cells 12a are placed and having no interconnect layer. The width of the second basic cells 12b is smaller than the width of the first basic cells 12a and larger than the width of the diode cell 13.

The diode cell 13 is placed in at least a part of regions (unoccupied regions in FIG. 9) of the logic circuit placement region 10 in which no standard cells 11, no first basic cells 12a, and no second basic cells 12b are placed. The diode cell 13 includes the first diode that is connected between the gate electrode of a predetermined transistor and the first power supply line as well as the second diode that is connected between that gate electrode and the second power supply line.

The diode cell 13 has the smallest size among the above-described cells. The sizes of the individual standard cells 11 are M times the size of the diode cell 13 (M is an integer of 2 or more), the size of the first basic cells 12a is N1 times the size of the diode cell 13 (N1 is an integer of 3 or more), and the size of the second basic cells 12b is N2 times the size of the diode cell 13 (N2 is an integer of 2 or more, where N2 is smaller than N1).

Hereinafter, a case where the lengths of the individual standard cells 11, the length of the first basic cells 12a, the length of the second basic cells 12b, and the length of the diode cell 13 are substantially equal will be described as an example. In that case, the widths of the individual standard cells 11 are M times the width of the diode cell 13, the width of the first basic cells 12a is N1 times the width of the diode cell 13, and the width of the second basic cells 12b is N2 times the width of the diode cell 13.

That is to say, the width of the second basic cells 12b is smaller than the width of the first basic cells 12a and larger than the width of the diode cell 13. It is therefore possible to place the second basic cells 12b in unoccupied regions of the logic circuit placement region 10 after the standard cells 11 and the first basic cells 12a are placed, and furthermore to place the diode cell 13 in an unoccupied region after the second basic cells 12b are placed. For example, a configuration may be adopted in which the width of the first basic cells 12a is approximately three times the width of the diode cell 13 and the width of the second basic cell 12b is approximately twice the width of the diode cell 13.

The first basic cells 12a can be used to configure a functional block that is required in performing circuit modification, and therefore it is desirable to place as many first basic cells 12a as possible in regions of the logic circuit placement region 10 in which no standard cells 11 are placed. Moreover, a larger-scale functional block can be configured using a plurality of first basic cells 12a, and therefore, in the case where a region in which no standard cells 11 are placed has a width that is two or more times the width of the first basic cells 12a in the X-axis direction shown in FIG. 9, it is desirable to contiguously place a plurality of first basic cells 12a therein.

The second basic cells 12b are placed using regions in which the standard cells 11 and the first basic cells 12a cannot be placed. The second basic cells 12b also can be used to configure a functional block that is required in performing circuit modification, and therefore it is desirable to place as many second basic cells 12b as possible in regions of the logic circuit placement region 10 in which no standard cells 11 and no first basic cells 12a are placed. Moreover, a larger-scale functional block can be configured by combining a second basic cell 12b with one or more first basic cells 12a, and therefore it is desirable to place a second basic cell 12b contiguously with a first basic cell 12a in the X-axis direction shown in FIG. 9.

The diode cell 13 is placed using an unoccupied region in which the standard cells 11, the first basic cells 12a, and the second basic cells 12b cannot be placed. Accordingly, in the direction (X-axis direction in FIG. 9) that is orthogonal to the longitudinal direction of the diode cell 13, the diode cell 13 is placed in at least a part of regions between two adjacent standard cells 11, regions between a standard cell 11 and a first basic cell 12a or a second basic cell 12b, or regions at an end portion of the logic circuit placement region 10. That is to say, no diode cell 13 is placed in regions between two adjacent first basic cells 12a, regions between a first basic cell 12a and a second basic cell 12b, and regions between two adjacent second basic cells 12b.

Figure 10:
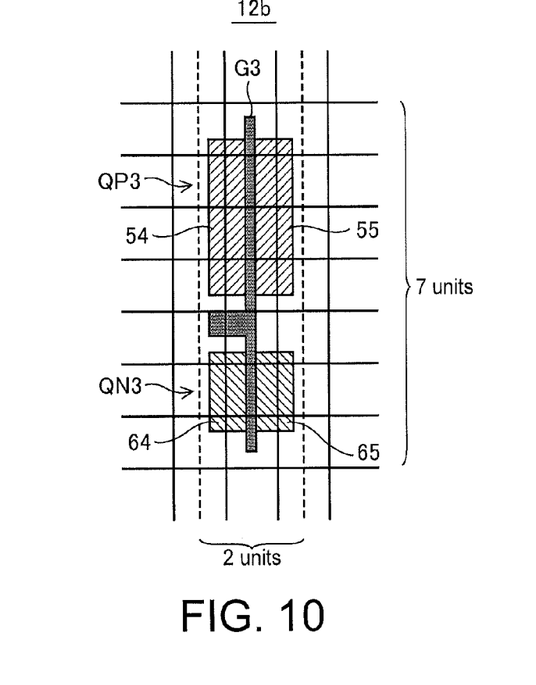
FIG. 10 is a plan view showing an example of the layout of a second basic cell in FIG. 9.

FIG. 10 is a plan view showing an example of the layout of a second basic cell in FIG. 9. In FIG. 10, in order to clearly indicate the size of the second basic cells 12b, a grid (lattice) based on which the layout of the semiconductor integrated circuit device is designed is shown. In the example shown in FIG. 10, the second basic cell 12b has a length of seven units of the grid and a width of two units.

The second basic cell 12b includes, for example, a P channel MOS transistor QP3 and an N-channel MOS transistor QN3 that have a common gate electrode G3. P-type impurity diffusion regions 54 and 55 are formed in an N-well of a semiconductor substrate or an N-type semiconductor substrate. The source and the drain of the transistor QP3 are configured by the P-type impurity diffusion regions 54 and 55. On the other hand, N-type impurity diffusion regions 64 and 65 are formed in a P-well of the semiconductor substrate or a P-type semiconductor substrate. The source and the drain of the transistor QN3 are configured by the N-type impurity diffusion regions 64 and 65.

Placement of the second basic cells 12b in a part of regions of the logic circuit placement region 10 shown in FIG. 9 in which no standard cells 11 and no first basic cells 12a are placed makes it possible to even more flexibly deal with circuit modification by simply changing the interconnect layer, even if circuit modification is performed after a photomask for use in the manufacturing process of the semiconductor integrated circuit device is produced. That is to say, various types of functional blocks can be configured by connecting interconnects to one or more first basic cells 12a and a second basic cell 12b that are contiguously placed in the X-axis direction shown in FIG. 9. Alternatively, an inverter can be configured by connecting interconnects to a second basic cell 12b.

Figure 11:
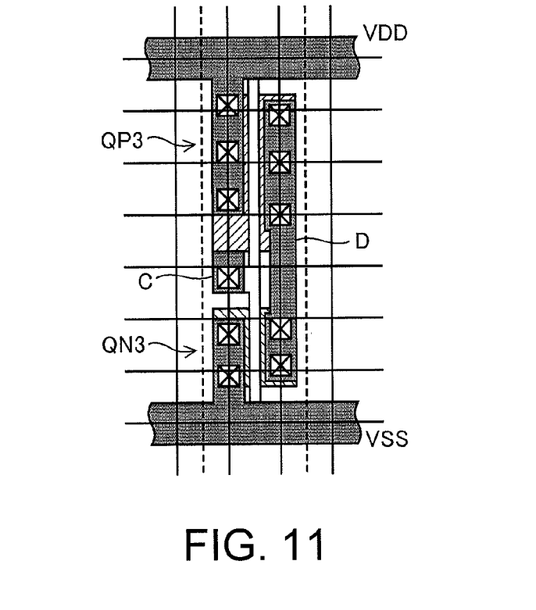
FIG. 11 is a plan view of the layout of an inverter that is configured using the second basic cell.

FIG. 11 is a plan view showing an example of the layout of an inverter that is configured using the second basic cell shown in FIG. 10. In FIG. 11, the "x" marks indicate the positions of through holes that are formed in an interlayer dielectric. Interconnects that are formed on the interlayer dielectric are connected to the gate electrodes or the impurity diffusion regions of the plurality of transistors included in the second basic cell 12b via the through holes.

Figure 12:
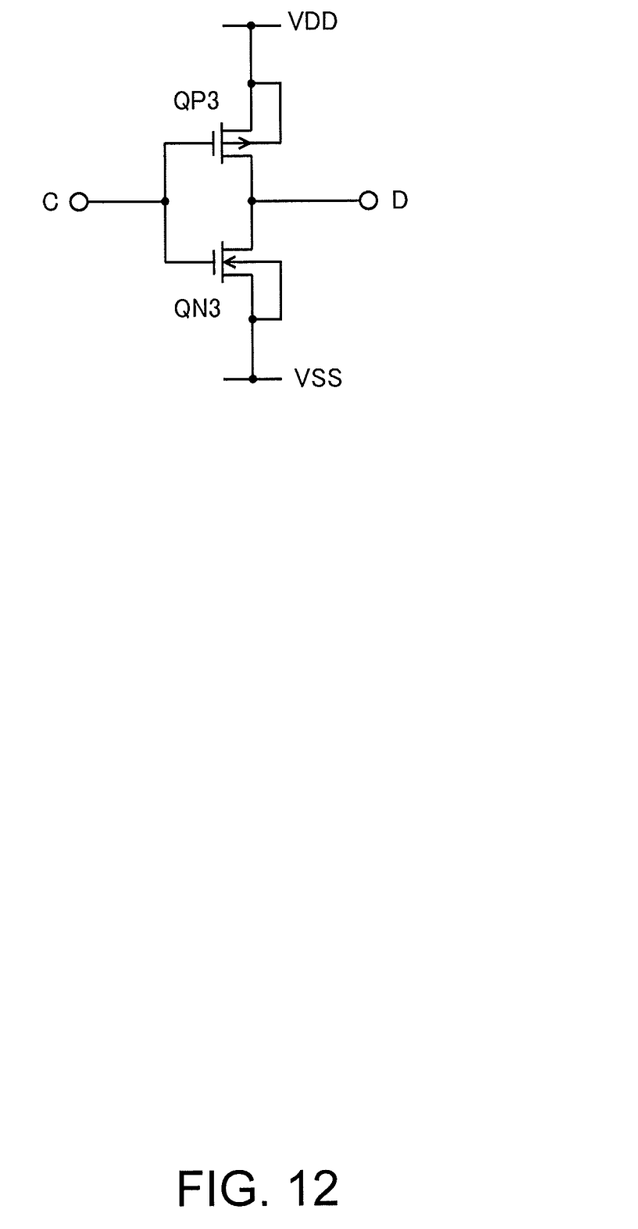
FIG. 12 is a circuit diagram showing the configuration of the inverter shown in FIG. 11.

FIG. 12 is a circuit diagram showing the configuration of the inverter shown in FIG. 11. As shown in FIGS. 11 and 12, in this inverter, the source of the transistor QP3 is connected to the first power supply line to which the power supply potential VDD is supplied, the drain of the transistor QP3 is connected to an interconnect of an output terminal D, and the gate of the transistor QP3 is connected to an interconnect of an input terminal C.

Also, the drain of the transistor QN3 is connected to the interconnect of the output terminal D, the source of the transistor QN3 is connected to the second power supply line to which the power supply potential VSS is supplied, and the gate of the transistor QN3 is connected to the interconnect of the input terminal C. Thus, the inverter inverts the level of an input signal supplied to the input terminal C and outputs an output signal having the inverted level from the output terminal D.

Figure 13:
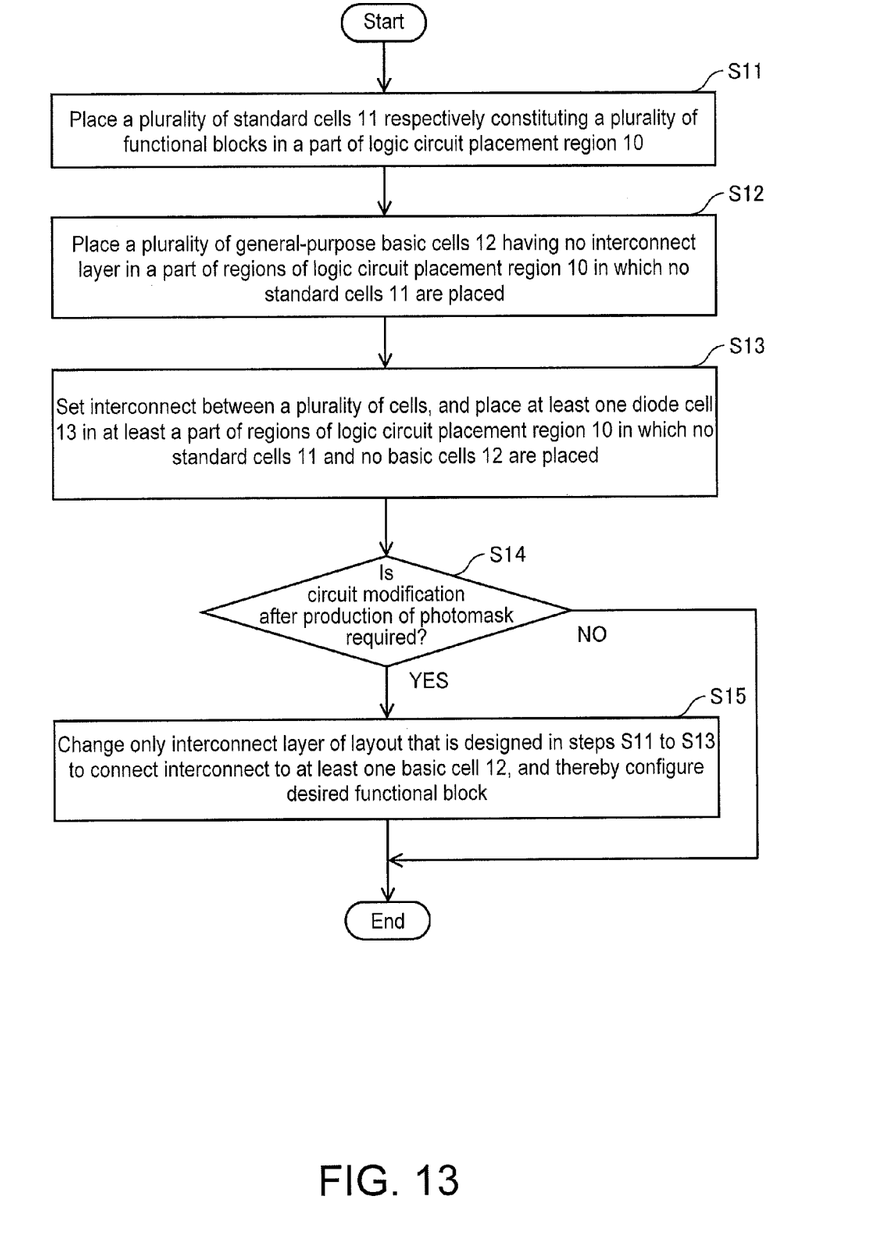
FIG. 13 is a flowchart illustrating a layout design method according to the first embodiment.

Next, a method for designing the layout of the semiconductor integrated circuit device according to the first embodiment of the invention will be described with reference to FIGS. 2 and 13. FIG. 13 is a flowchart illustrating the method for designing the layout of the semiconductor integrated circuit device according to the first embodiment of the invention. Note that the layout design methods according to various embodiments of the invention are for layout design of a logic circuit.

At a stage prior to layout design, a netlist is created by performing circuit design of the semiconductor integrated circuit device. The netlist contains information that specifies a plurality of standard cells respectively constituting a plurality of functional blocks that realize the logic functions of the semiconductor integrated circuit device and information that specifies connection relationships between those standard cells.

The created netlist is input to a computer, and software (automatic placement and routing tool) running on the computer performs layout design of the logic circuit based on the netlist. At this time, a library that stores information regarding the layouts of the standard cells 11, the basic cells 12, and the diode cell 13 is used.

In step S11, the automatic placement and routing tool places the plurality of standard cells 11, which respectively constitute the plurality of functional blocks that realize the logic functions of the semiconductor integrated circuit device, in a part of the logic circuit placement region 10. Thus, the positions of the gate electrodes, the sources, and the drains of the plurality of transistors included in the standard cells 11 are determined, and interconnects inside the standard cells 11 are determined.

In step S12, the automatic placement and routing tool places the plurality of general-purpose basic cells 12 (see FIG. 3) that have no interconnect layer in a part of regions of the logic circuit placement region 10 in which no standard cells 11 are placed. Thus, the positions of the gate electrodes, the sources, and the drains of the plurality of transistors included in the basic cells 12 are determined.

Since the basic cells 12 can be used to configure a functional block that is required in performing circuit modification, it is desirable to place as many basic cells 12 as possible in regions of the logic circuit placement region 10 in which no standard cells 11 are placed. Moreover, since a larger-scale functional block can be configured using a plurality of basic cells 12, in the case where a region in which no standard cells 11 are placed has a width that is two or more times the width of the basic cells 12 in the X-axis direction shown in FIG. 2, it is desirable to contiguously place a plurality of basic cells 12 therein.

In step S13, the automatic placement and routing tool sets interconnects between a plurality of cells. At the same time, the automatic placement and routing tool places the at least one diode cell 13 (see FIGS. 6 and 7) in at least a part of regions of the logic circuit placement region 10 in which no standard cells 11 and no basic cells 12 are placed.

Thus, the positions of the anodes and the cathodes of the first and second diodes included in the diode cell 13 are determined. Moreover, the first diode is connected between the gate electrode of a transistor to be protected and the first power supply line, and the second diode is connected between that gate electrode and the second power supply line (see FIG. 8).

According to the above-described procedure, it is highly likely that a plurality of basic cells 12 can be contiguously placed in preparation for circuit modification after the production of a photomask, and this provides an advantage that, for example, in the case where a latch circuit with a reset is to be added in circuit modification, a region for contiguously placing six basic cells 12 is easily secured. Also, unoccupied regions after the placement of the basic cells 12 are substantially uniformly scattered throughout the logic circuit placement region 10, so that the diode cell 13 can be placed near a transistor to be protected, and it is thus possible to take a sufficient countermeasure against the antenna effect.

In step S14, whether or not circuit modification is required after the photomask for use in the manufacturing process of the semiconductor integrated circuit device is produced is judged. If circuit modification is required, the netlist is modified. Furthermore, a replacement netlist in which at least one basic cell 12 is replaced by a functional block is created based on the modified netlist. The created replacement netlist is input to the computer, and the software (automatic placement and routing tool) running on the computer modifies the layout of the logic circuit based on the replacement netlist.

In step S15, the automatic placement and routing tool changes only the interconnect layer in the layout that is designed in steps S11 to S13 to connect the interconnects to the at least one basic cell 12, and thereby configures a desired functional block. The functional block that is configured by the basic cell 12 is used to realize a logic function of the semiconductor integrated circuit device together with the plurality of standard cells 11 or instead of a part of the standard cells 11.

According to the first embodiment of the invention, the general-purpose basic cells 12 and the protective diode cell 13 are placed in regions of the logic circuit placement region 10 in which no standard cells 11 are placed, and the basic cells 12 can be used as a functional block by simply changing the interconnect layer. Therefore, a semiconductor integrated circuit device that ensures flexibility with respect to circuit modification even if circuit modification is performed after a photomask for use in the manufacturing process of the semiconductor integrated circuit device is produced and that is capable of realizing a countermeasure against the antenna effect can be provided without increasing the area of the semiconductor substrate.

Figure 14:
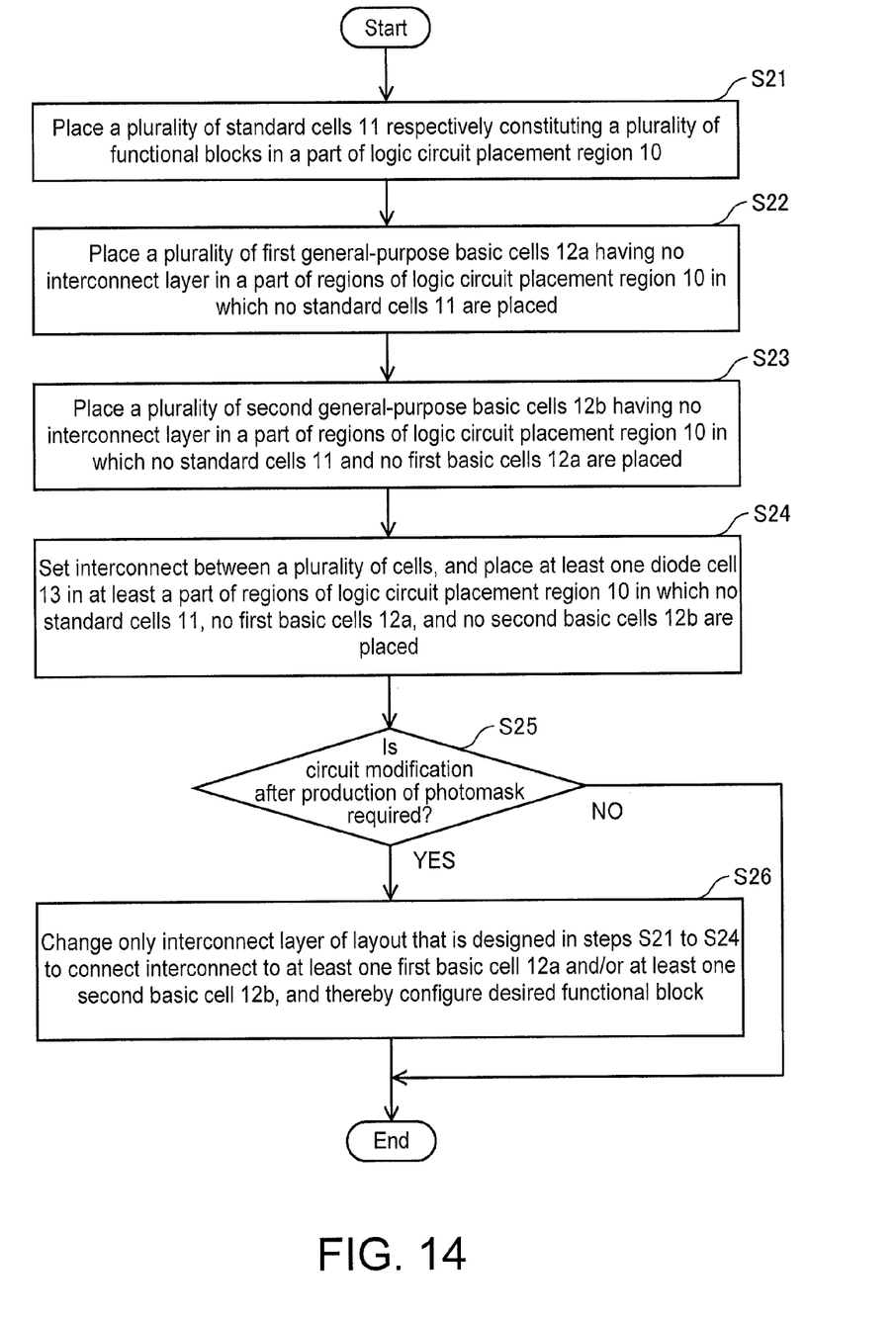
FIG. 14 is a flowchart illustrating a layout design method according to the second embodiment.

Next, a method for designing the layout of the semiconductor integrated circuit device according to the second embodiment of the invention will be described with reference to FIGS. 9 and 14. FIG. 14 is a flowchart illustrating the method for designing the layout of the semiconductor integrated circuit device according to the second embodiment of the invention. In the second embodiment, the first basic cells 12a and the second basic cells 12b shown in FIG. 9 are used as the basic cells. Otherwise, the layout design method according to the second embodiment is similar to the layout design method according to the first embodiment.

In step S21, the automatic placement and routing tool places the plurality of standard cells 11, which respectively constitute the plurality of functional blocks that realize the logic functions of the semiconductor integrated circuit device, in a part of the logic circuit placement region 10. Thus, the positions of the gate electrodes, the sources, and the drains of the plurality of transistors included in the standard cells 11 are determined, and interconnects inside the standard cells 11 are determined.

In step S22, the automatic placement and routing tool places the plurality of first general-purpose basic cells 12a that have no interconnect layer in a part of regions of the logic circuit placement region 10 in which no standard cells 11 are placed. The first basic cells 12a may be similar to the basic cells 12 shown in FIG. 3. Thus, the positions of the gate electrodes, the sources, and the drains of the plurality of transistors included in the first basic cells 12a are determined.

Since the first basic cells 12a can be used to configure a functional block that is required in performing circuit modification, it is desirable to place as many first basic cells 12a as possible in regions of the logic circuit placement region 10 in which no standard cells 11 are placed. Moreover, since a larger-scale functional block can be configured using a plurality of first basic cells 12a, in the case where a region in which no standard cells 11 are placed has a width that is two or more times the width of the first basic cells 12a in the X-axis direction shown in FIG. 9, it is desirable to contiguously place a plurality of first basic cells 12a therein.

In step S23, the automatic placement and routing tool places the plurality of second general-purpose basic cells 12b that have no interconnect layer in a part of regions of the logic circuit placement region 10 in which no standard cells 11 and no first basic cells 12a are placed. The width of the second basic cells 12b is smaller than the width of the first basic cells 12a and larger than the width of the diode cell 13. Thus, the positions of the gate electrodes, the sources, and the drains of the plurality of transistors included in the second basic cells 12b are determined.

The second basic cells 12b are placed using regions in which the standard cells 11 and the first basic cells 12a cannot be placed. Since the second basic cells 12b also can be used to configure a functional block that is required in performing circuit modification, it is desirable to place as many second basic cells 12b as possible in regions of the logic circuit placement region 10 in which no standard cells 11 and no first basic cells 12a are placed. Moreover, since a larger-scale functional block can be configured by combining a second basic cell 12b with one or more first basic cells 12a, it is desirable to place a second basic cell 12b contiguously with a first basic cell 12a in the X-axis direction shown in FIG. 9.

In step S24, the automatic placement and routing tool sets interconnects between a plurality of cells. At the same time, the automatic placement and routing tool places the at least one diode cell 13 (see FIGS. 6 and 7) in at least a part of regions of the logic circuit placement region 10 in which no standard cells 11, no first basic cells 12a, and no second basic cells 12b are placed.

Thus, the positions of the anodes and the cathodes of the first and second diodes included in the diode cell 13 are determined. Moreover, the first diode is connected between the gate electrode of a predetermined transistor and the first power supply line, and the second diode is connected between that gate electrode and the second power supply line (see FIG. 8).

According to the above-described procedure, it is highly likely that a plurality of first basic cells 12a can be contiguously placed in preparation for circuit modification after the production of the photomask, and this provides an advantage that, for example, in the case where a latch circuit with a reset is to be added in circuit modification, a region for contiguously placing six first basic cells 12a is easily secured. Moreover, unoccupied regions after the placement of the first basic cells 12a and the second basic cells 12b are uniformly scattered throughout the logic circuit placement region 10, so that the diode cell 13 can be placed near a transistor to be protected, and it is thus possible to take a sufficient countermeasure against the antenna effect.

In step S25, whether or not circuit modification is required after the photomask for use in the manufacturing process of the semiconductor integrated circuit device is produced is judged. If circuit modification is required, the netlist is modified. Furthermore, a replacement netlist in which at least one first basic cell 12a and/or at least one second basic cell 12b is replaced by a functional block is created based on the modified netlist. The created replacement netlist is input to the computer, and the software (automatic placement and routing tool) running on the computer modifies the layout of the logic circuit based on the replacement netlist.

In step S26, the automatic placement and routing tool changes only the interconnect layer of the layout that is designed in steps S21 to S24 to connect the interconnects to the at least one first basic cell 12a and/or the at least one second basic cell 12b, and thereby configures a desired functional block. The functional block that is configured by the first basic cell 12a and/or the second basic cell 12b is used to realize a logic function of the semiconductor integrated circuit device together with the plurality of standard cells 11 or instead of a part of the standard cells 11.

According to the second embodiment of the invention, the first and second general-purpose basic cells 12a and 12b and the protective diode cell 13 are placed in regions of the logic circuit placement region 10 in which no standard cells 11 are placed, and the first basic cells 12a and the second basic cells 12b can be used as a functional block by simply changing the interconnect layer. Therefore, a semiconductor integrated circuit device that further increases the flexibility with respect to circuit modification even if circuit modification is performed after the photomask for use in the manufacturing process of the semiconductor integrated circuit device is produced and that is capable of realizing a countermeasure against the antenna effect can be provided without increasing the area of the semiconductor substrate.

The invention is not limited to the embodiments described above, and it will be understood by those skilled in the art that many variations may be made without departing from the technical idea of the invention.

This application claims priority from Japanese Patent Application No. 2013-265007 filed in the Japanese Patent Office on Dec. 24, 2013, the entire disclosure of which is hereby incorporated by reference in its entirely.

What is claimed is:

1. A method for designing a layout of a semiconductor integrated circuit device, the method comprising:
    (a) placing, by a computer, a plurality of standard cells respectively constituting a plurality of functional blocks that realize logic functions of the semiconductor integrated circuit device in a part of a logic circuit placement region;
    (b) placing, by the computer, a plurality of basic cells in a part of regions of the logic circuit placement region in which no standard cells are placed; and
    (c) placing, by the computer, along a longitudinal direction of a row of the logic circuit placement region where the standard cells, basic cells and at least one diode cell are placed, at least one diode cell having a longitudinal direction defining a length and a direction transverse to the longitudinal direction defining a width, wherein the length is greater than the width, and wherein the diode cell is placed with a length of the diode cell transverse to the longitudinal direction of the row in at least a part of regions of the logic circuit placement region in which no standard cells and no basic cells are placed, the diode cell including a first diode that is connected between a gate electrode of a predetermined transistor and a first power supply line and a second diode that is connected between the gate electrode and a second power supply line.

2. The method for designing a layout according to claim 1,
    wherein the basic cells have a width that is larger than a width of the diode cell, and the standard cells, the basic cells, and the diode cell have substantially equal lengths.

3. The method for designing a layout according to claim 1,
    wherein (b) placing the plurality of basic cells includes (b1) placing a plurality of first basic cells in a part of regions of the logic circuit placement region in which no standard cells are placed and (b2) placing a plurality of second basic cells in a part of regions of the logic circuit placement region in which no standard cells and no first basic cells are placed, the second basic cells having a width that is smaller than a width of the first basic cells and larger than a width of the diode cell.

4. The method for designing a layout according to claim 3,
    wherein the width of the first basic cells is approximately three times the width of the diode cell, the width of the second basic cells is approximately twice the width of the diode cell, and the standard cells, the first basic cells, the second basic cells, and the diode cell have substantially equal lengths.

5. The method for designing a layout according to claim 1,
    wherein the basic cells or the first basic cells each include a first P-channel transistor and a first N-channel transistor that have a common first gate electrode, and a second P-channel transistor and a second N-channel transistor that have a common second gate electrode.

6. The method for designing a layout according to claim 3,
    wherein the second basic cells each include a third P-channel transistor and a third N-channel transistor that have a common third gate electrode.

7. A semiconductor integrated circuit device including a semiconductor substrate having a logic circuit placement region, the semiconductor integrated circuit device comprising:
    a plurality of standard cells that are placed in a part of the logic circuit placement region and respectively constitute a plurality of functional blocks that realize logic functions of the semiconductor integrated circuit device;
    a plurality of basic cells that are placed in a part of regions of the logic circuit placement region in which no standard cells are placed; and
    at least one diode cell that has a longitudinal direction defining, a length and a direction transverse to the longitudinal direction defining a width, wherein the length is greater than the width, and wherein the standard cells, basic cells and at least one diode cell are placed along a longitudinal direction of a row of the logic circuit placement region, with the at least one diode cell placed with a length of the diode cell transverse to the longitudinal direction of the row, and the at least one diode cell is placed in at least a part of regions of the logic circuit placement region in which no standard cells and no basic cells are placed, the diode cell including a first diode that is connected between a gate electrode of a predetermined transistor and a first power supply line and a second diode that is connected between the gate electrode and a second power supply line,
    wherein the diode cell is placed in at least a part of regions between two adjacent standard cells, regions between a standard cell and a basic cell, or regions at an end portion of the logic circuit placement region.

8. The semiconductor integrated circuit device according to claim 7,
    wherein the plurality of basic cells include a plurality of first basic cells that are placed in a part of regions of the logic circuit placement region in which no standard cells are placed, and a plurality of second basic cells that are placed in a part of regions of the logic circuit placement region in which no standard cells and no first basic cells are placed, the second basic cells having a width that is smaller than a width of the first basic cells and larger than a width of the diode cell.

* * * * *